(12) United States Patent
Albert (10) Patent No.: US 7,073,410 B2
(45) Date of Patent: Jul. 11, 2006

(54) HYDRAULIC MOTOR VEHICLE GEARBOX CONTROL DEVICE WITH A PLASTIC HYDRAULIC DISTRIBUTION PLATE AND CONDUCTORS INTEGRATED THEREIN

(75) Inventor: Roland Albert, Regensburg (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 10/618,340

(22) Filed: Jul. 11, 2003

(65) Prior Publication Data

US 2004/0134549 A1 Jul. 15, 2004

Related U.S. Application Data

(63) Continuation of application No. PCT/DE02/00043, filed on Jan. 9, 2002.

(30) Foreign Application Priority Data

Jan. 11, 2001 (DE) ................................ 101 01 091

(51) Int. Cl.
*F16H 57/02* (2006.01)
*H05K 7/20* (2006.01)

(52) U.S. Cl. .................... 74/606 R; 361/689
(58) Field of Classification Search ............. 74/606 R; 475/112, 123; 477/51; 361/698–9, 689, 361/702; 165/80.4
See application file for complete search history.

(56) References Cited

U.S. PATENT DOCUMENTS

| | | | |
|---|---|---|---|
| 3,836,823 A | * 9/1974 | Shields | ........................ 361/689 |
| 4,378,760 A | 4/1983 | Barge | ....................... 123/41.12 |
| 4,381,032 A | * 4/1983 | Cutchaw | ..................... 361/689 |
| 4,559,864 A | 12/1985 | Sakakibara et al. | ........... 91/454 |
| 4,805,490 A | * 2/1989 | Fuehrer et al. | ........... 74/606 R |
| 4,964,524 A | 10/1990 | Halene | ........................ 220/3 |
| 5,210,440 A | 5/1993 | Long | ........................ 257/575 |
| 5,245,508 A | 9/1993 | Mizzi | ........................ 361/694 |
| 5,276,584 A | 1/1994 | Collins et al. | ............. 361/718 |
| 5,361,650 A | 11/1994 | Klecker et al. | ........... 76/606 R |
| 5,495,889 A | * 3/1996 | Dubelloy | ..................... 361/688 |
| 5,611,372 A | * 3/1997 | Bauer et al. | ............. 74/606 R |
| 5,662,007 A | 9/1997 | Starker et al. | ........... 74/606 A |
| 5,709,134 A | * 1/1998 | Ulm | ........................ 74/606 R |
| 5,749,060 A | * 5/1998 | Graf et al. | ................ 74/606 R |
| 5,823,070 A | 10/1998 | Taniguchi et al. | ........ 74/606 R |
| 5,848,848 A | 12/1998 | St. Jean | ........................ 400/88 |
| 5,940,271 A | * 8/1999 | Mertol | ........................ 361/704 |
| 5,941,137 A | * 8/1999 | Beer et al. | ................ 74/606 R |
| 5,966,291 A | * 10/1999 | Baumel et al. | ............. 361/707 |
| 6,160,708 A | * 12/2000 | Loibl et al. | ................ 361/704 |

(Continued)

FOREIGN PATENT DOCUMENTS

| | | |
|---|---|---|
| DE | 43 44 584 C2 | 12/1996 |
| DE | 29513950 U1 | 1/1997 |
| DE | 197 10 931 A1 | 10/1997 |
| DE | 19715592 A1 | 10/1998 |
| DE | 198 11 610 C1 | 8/1999 |
| EP | 0841842 A1 | 11/1997 |

*Primary Examiner*—Roger Pang
(74) *Attorney, Agent, or Firm*—Baker Botts L.L.P.

(57) ABSTRACT

A hydraulic motor vehicle comprises a plastic hydraulic distributor plate (1) with channels (13a, 13b, 13c, 13d) for the distribution of hydraulic fluid extending therethrough. Electric conductors (9) of the gearbox control device are embedded in the hydraulic distributor plate (1) and/or electric conductors are metallized onto the surface of the hydraulic distributor plate (1).

21 Claims, 6 Drawing Sheets

U.S. PATENT DOCUMENTS

| | | | |
|---|---|---|---|
| 6,164,160 A * | 12/2000 | Nassar | 74/606 R |
| 6,189,396 B1 * | 2/2001 | Barnreiter et al. | 74/335 |
| 6,302,190 B1 * | 10/2001 | Clamp et al. | 165/80.4 |
| 6,396,692 B1 | 5/2002 | Farshi et al. | 361/690 |
| 6,411,512 B1 | 6/2002 | Mankaruse et al. | 361/700 |
| 6,679,137 B1 | 1/2004 | Bek | 74/606 R |
| 6,695,748 B1 * | 2/2004 | Kopec et al. | 74/606 R |
| 2002/0088304 A1 * | 7/2002 | Thorum et al. | 74/606 R |

* cited by examiner

HYDRAULIC MOTOR VEHICLE GEARBOX CONTROL DEVICE WITH A PLASTIC HYDRAULIC DISTRIBUTION PLATE AND CONDUCTORS INTEGRATED THEREIN

CROSS REFERENCE TO RELATED APPLICATIONS

This application is a continuation of co-pending International Application No. PCT/DE02/00043 filed Jan. 9, 2002 which designates the United States and claims priority to German application no. DE10101091.5 dated Jan. 11, 2001.

TECHNICAL BACKGROUND

The invention relates to a hydraulic motor vehicle gearbox control unit with a hydraulic distribution plate, in which channels extend for hydraulic fluid, and method for its manufacture.

BACKGROUND OF THE INVENTION

In recent years integrated electronic/hydraulic gearbox control systems have increasingly been used in motor vehicle gearboxes. Integrated gearbox control systems are characterized in that the electronic control unit for the hydraulic control device is located within the gearbox. This concept is also referred to using the term "local electronics".

In addition to the known advantages, a series of problems are known to occur with integrating the electronic control unit into the gearbox. The electronic control unit has to be protected from the environment (oil) prevailing in the gearbox. Also good dissipation of the power loss in the electronic control unit must be ensured. One important consideration is signal and power distribution within the gearbox, i.e. the establishment of electrical connections between the electronic control unit and the solenoid valves, pressure switches, pressure sensors, temperature sensors, etc. and in some cases a gearbox connector, which connects the entire system to electrical peripherals outside the gearbox housing. The electric cabling must allow the best possible electrical routing taking into account structural conditions and must also be able to withstand high levels of mechanical stress (vibration acceleration up to around 33 g).

The gearbox is controlled mechanically by means of a hydraulic gearbox control device, which is responsible for distribution, pressure amplification and amplification of the volume flow rate of the hydraulic fluid as well as any further hydraulic tasks. The hydraulic gearbox control device contains one or more metal plates (valve plate, channel plate), through which channels extend to distribute the hydraulic fluid and which also serve as securing elements for actuators (e.g. solenoid valves) and sensors.

Electronic control units are currently produced in the form of independent electronic modules. The modules comprise a sealed metal housing, in which the electronic circuit is housed. It is mounted for example on the valve plate or the channel plate of the hydraulic control device, with the power loss being dissipated via this metal plate. A circuit board is generally used for signal and power distribution in the gearbox and this is secured to the metal plate. Another solution is to establish the electrical connections using punched lattices or wires embedded in plastic components. Finally cable harnesses laid in the gearbox can also be used as electrical connection elements.

A hydraulic gearbox control device for an automatic gearbox is disclosed in German patent specification DE 43 44 584 C2. The hydraulic control device comprises two metal plates separated by an intermediate sheet. The upper metal plate is used to secure the solenoid valves. A circuit board is arranged on this metal plate. The conductor paths of the circuit board are made from punched sheet metal components, which are sunk into and supported in corresponding recessed grooves on the circuit board.

SUMMARY OF THE INVENTION

The object of the invention is to create a hydraulic motor vehicle gearbox control device, in particular for use in an automatic gearbox, which allows simple and mechanically stable establishment of the electric conductor paths for linking electrical components of the device. A method for manufacturing this should also be specified.

The object of the invention can be achieved by a hydraulic motor vehicle gearbox control device, comprising a hydraulic distribution plate made of plastic, in which channels extend for the distribution of hydraulic fluid and in which electric conductors of the gearbox control device are embedded, in particular are fully sheathed and/or on the surface of which electric conductors of the gearbox control device are metallized.

The conductors embedded in the hydraulic distribution plate may be encapsulated or sprayed metal wires, pins, strips or punched lattices. The hydraulic distribution plate can be configured as an injection molded MID circuit support. The conductors may extend between an electronic control unit module secured on the hydraulic distribution plate and at least one solenoid valve for the hydraulic control system. The conductors may extend between an electronic control unit module secured on the hydraulic distribution plate and a gearbox connector attached to the distribution plate. The electronic control unit module can be in contact with the electric conductors via a flexible circuit board. A channel can be arranged for hydraulic fluid in the hydraulic distribution plate adjacent to the electronic control unit module. The electronic control unit module may have a metal base plate, which is cast in the hydraulic distribution plate. A section of the surface of the hydraulic distribution plate may form the base plate of the electronic control unit module, and a circuit support of the electronic control unit module can be secured directly onto this section of the surface of the hydraulic distribution plate.

The object can also be achieved by a method for manufacturing a hydraulic motor vehicle gearbox control device comprising a plastic hydraulic distribution plate, comprising the steps of:
 providing channels in the distribution plate which extend for the distribution of hydraulic fluid,
 embedding, in particular fully sheathing, electric conductors of the gearbox control device, and
 metallizing electric conductors of the gearbox control device on the surface of the distribution plate, wherein the conductors are integrated into the hydraulic distribution plate by spraying or encapsulating or mortising or sticking.

The conductors can be integrated into the hydraulic distribution plate by means of an MID method.

The basis of the invention is that it will be possible in future to design housing components for the hydraulic gearbox control device in the form of injection molded plastic components and to assemble them in a standard process. The idea behind the invention now is to combine hydraulic and electrical functions in a single such plastic component. This is achieved by structural integration of both the channels for the distribution of hydraulic fluid and the electric conductors in the same plastic component. The plastic component thereby forms a hydraulic distribution plate for the gearbox control device and at the same time provides a support element, on which the electric conductors required for signal and power distribution are formed or incorporated. This dual function of the plastic hydraulic distribution plate means that the electrical connection element in conventional gearbox control devices is no longer required.

The structural integration of the electric conductors into the hydraulic distribution plate can either be achieved by embedding the electric conductors in the plastic body of the hydraulic distribution plate and completely sheathing them in plastic as necessary. Another option is to metallize the electric conductors onto the surface of the hydraulic distribution plate. Conductor paths with a high level of mechanical stability are created in both cases.

In a first preferred embodiment of the invention the conductors embedded in the hydraulic distribution plate are encapsulated metal wires, pins, strips or punched lattices. During encapsulation the conductors can be either sheathed completely in plastic or their upper side can remain free from plastic.

A further, particularly preferred embodiment of the invention is characterized in that the hydraulic distribution plate is designed as an MID (Molded Interconnected Device) cable support. MID technology, as it is known, allows the manufacture of three-dimensionally injection molded cable supports—in this case the hydraulic distribution plate—in which the conductors are integrated. MID technology allows both the assembly of metal conductors on the surface of the hydraulic distribution plate and the creation of electric conductors, which are completely sheathed (radially) by the plastic material of the hydraulic distribution plate.

Preferably the electric conductors extend between an electronic control unit module secured to the hydraulic distribution plate and between a solenoid valve for the hydraulic control system. In a further advantageous variant of the invention the electric conductors are used to connect a gearbox connector attached to the distribution plate to the electronic control unit module.

With an electronic control unit module secured to the hydraulic distribution plate, a particularly preferred variant of the invention is characterized in that a channel for hydraulic fluid is located adjacent to the electronic control unit module in the hydraulic distribution plate. Effective dissipation of the heat loss from the electronic control unit module is achieved by the hydraulic fluid flowing past in immediate proximity to the electronic control unit module.

BRIEF DESCRIPTION OF THE DRAWINGS

The invention is described below using exemplary embodiments and variants with reference to the drawings. These show.

DETAILED DESCRIPTION OF THE PREFERRED EMBODIMENTS

Figure 1:
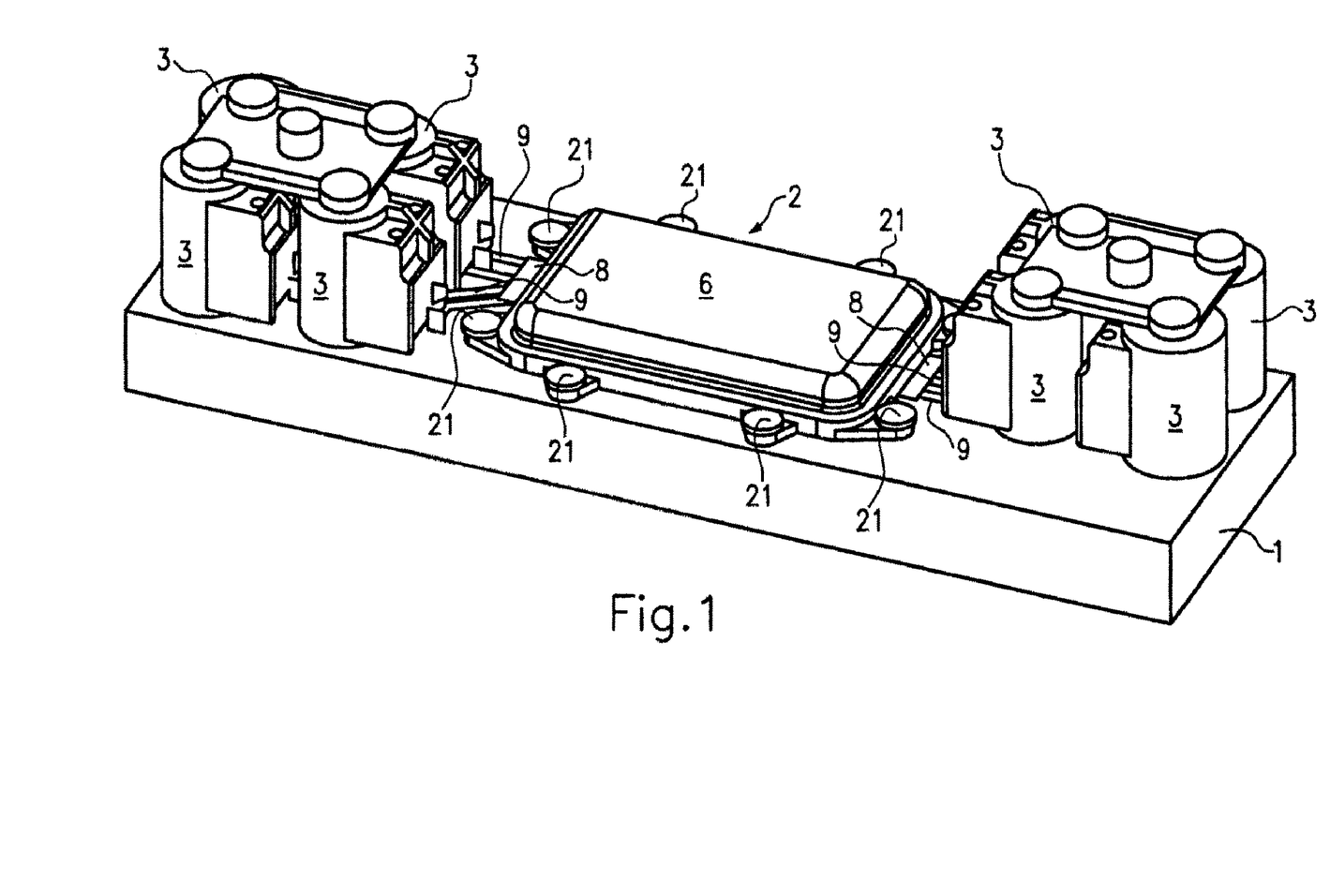
FIG. 1 a perspective view of a hydraulic distribution plate with attached solenoid valves and an electronic control unit module secured to the plate.
Figure 2:
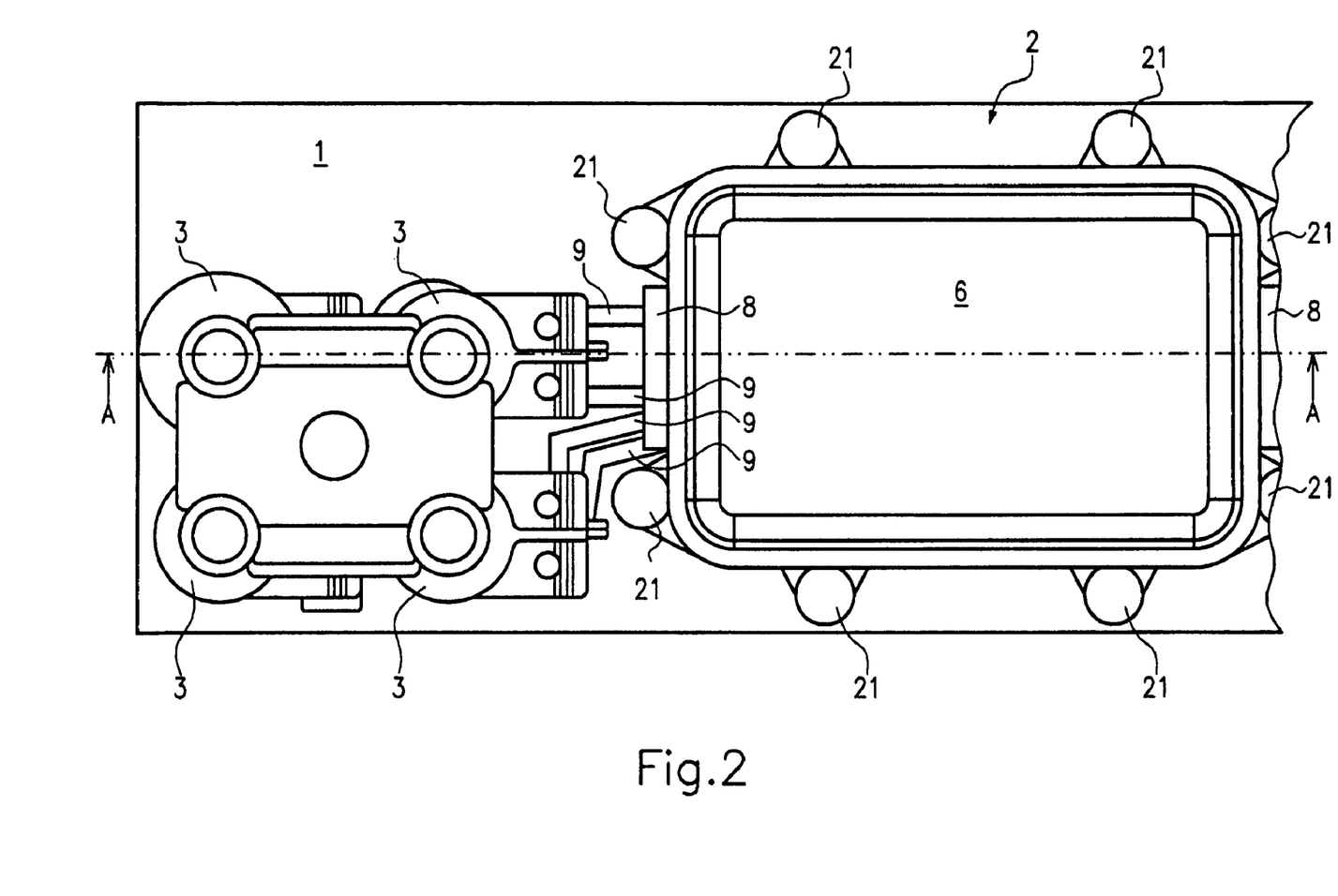
FIG. 2 a section of the arrangement shown in FIG. 1 viewed from above.

According to FIGS. 1 and 2 two valve modules each comprising four solenoid valves 3 and an electronic control unit module 2 located between the two valve modules are attached to a long, rectangular valve plate 1. The solenoid valves 3 are each set in holes, which penetrate the valve plate 1 and are connected to pneumatic channels (not identifiable in FIGS. 1 and 2), which run through the valve plate 1 and are described in more detail below.

The valve plate 1 is an injection molded plastic body. It forms part of a hydraulic control housing of a hydraulic motor vehicle gearbox control device. The gearbox control device (including the valve plate 1) is for example secured in the lower section of the gearbox housing so that it is within the oil sump.

Depending on the structural conditions, the valve plate 1 can have a different form from that shown in FIGS. 1 and 2. Also the hydraulic motor vehicle control device can have further plates, sheet metal screens, mechanical activation elements, etc. Generally what is known as a channel plate (not shown) is attached to the side of the valve plate 1 opposite the valves 3. The channel plate, which is also made of plastic or metal for example, contains further pneumatic channels and allows the distribution of hydraulic fluid at a second level.

Figure 3:
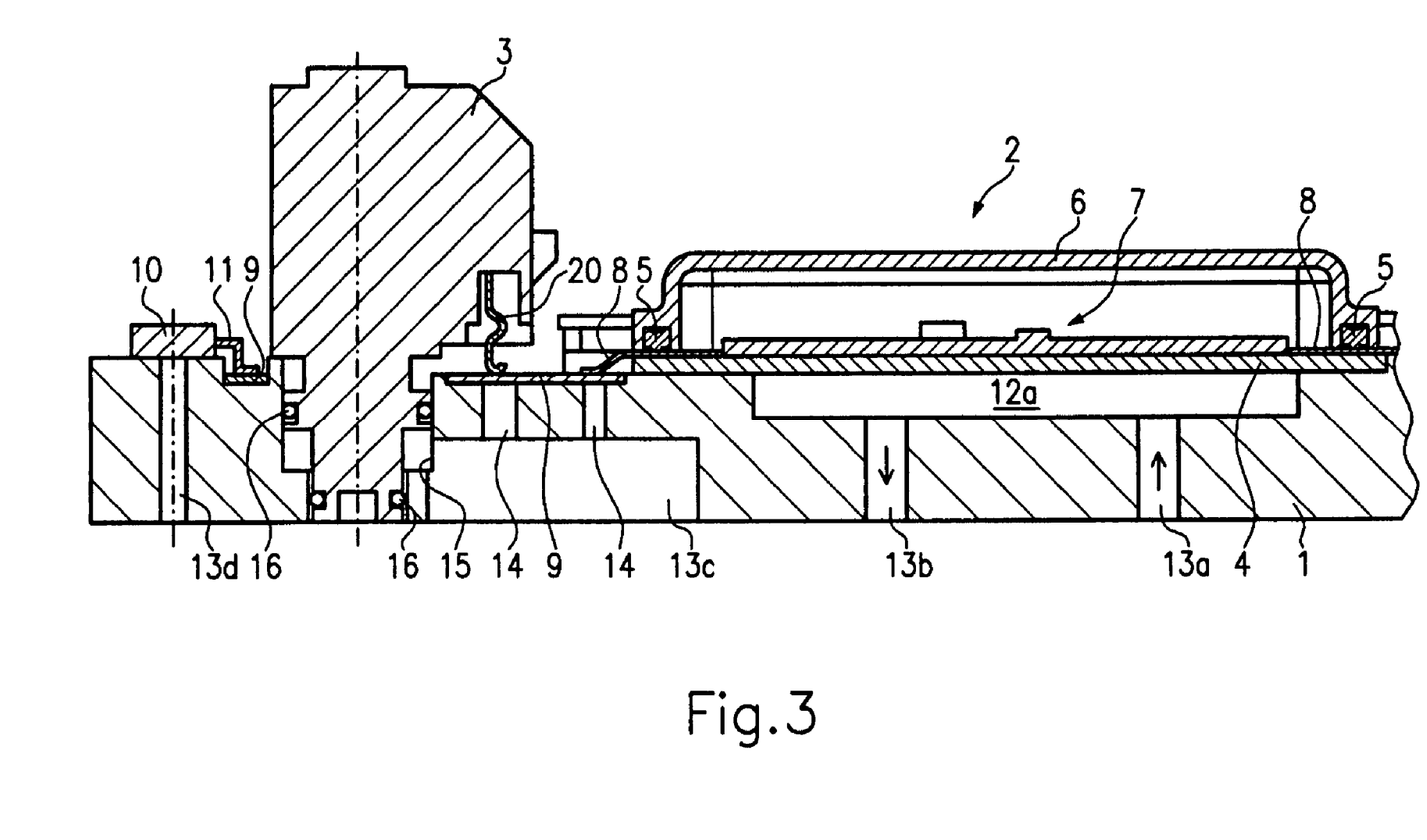
FIG. 3 a sectional representation of a variant of the arrangement shown in FIGS. 1 and 2 corresponding to a section along the line A—A in FIG. 2.

Reference is also made below to FIG. 3 to describe the arrangement shown in FIGS. 1 and 2 in more detail. The arrangement shown in FIG. 3 essentially corresponds to the arrangement shown in the previous figures but with only one solenoid valve 3 provided here instead of two solenoid valves 3 arranged longitudinally one behind the other (see FIGS. 1 and 2). The same or corresponding components have the same reference characters.

The electronic control unit module 2 has a metal base plate 4 and a housing cover 6 sealed to the base plate 4 by means of a shaped seal 5. The housing cover 6 made of metal or plastic can be attached using screws, rivets, compression pin connections 21, etc.

The electronic control unit is in the sealed inner chamber of the electronic control unit module 2. The electronic control unit is in the form of an assembled circuit support 7, for example a ceramic circuit board. The circuit support 7 is stuck directly to the surface of the base plate 4.

A flexible circuit board 8, which surrounds the circuit support 7 and is laminated (stuck) to the base plate 4 is used for electrical contact purposes. The flexible circuit board 8 leaves the module housing of the electronic control unit module 2 through a sealed gap between the base plate 4 and the shaped seal 5. Outside the module housing the flexible circuit board 8 extends to electric conductors 9, which are integrated in the valve plate 1.

The conductors 9 may be a punched lattice, wires, pins, metal strips, etc. The upper side of the conductors 9 may be uncovered, see FIGS. 1 to 3, or they may be completely sheathed by the plastic of the valve plate 1. For manufacturing purposes the conductors 9 may for example be structurally integrated in the valve plate 1 by injection molding or encapsulation. The conductors 9 may also be incorporated in the valve plate 1 by other measures, such as for example by mortising, sticking in conductor grooves, etc.

The conductors 9 incorporated in the valve plate 1 make contact with the solenoid valves 3 and other electrical functional elements of the hydraulic control device. Contact springs 20 are provided for electrical contact with each solenoid valve 3 and these press on the surface of the conductors 9 with a defined pressure. A pressure switch 10 is also shown and this is connected electrically to a conductor 9 by means of a punched flag 11.

The valve plate 1 contains channels and chambers, through which hydraulic fluid flows. A first chamber 12*a* lies directly below the base plate 4 and is limited by this with regard to cover. Hydraulic fluid flows through a channel 13*a* into the chamber 12*a*, flows through this and flows through another channel 13*b* out of the chamber 12*a*. This effectively cools the circuit electronics.

A further pneumatic channel 13*c* runs in immediate proximity to the solenoid valve 3, with the solenoid valve 3 exerting a controlling action on the fluid throughput through the channel 13*c* (not shown in greater detail).

A channel 13*d* also extends through the valve plate 1 to the pressure switch 10. The pressure switch 10 uses the channel 13*d* to detect a hydraulic fluid pressure, prevailing at the outlet of the channel 13*d*, i.e. at the lower side of the valve plate 1.

There are also holes 14 in the valve plate 1, which are exposed at the rear in the areas where the contact springs 20 and the flexible circuit board 8 contact the conductors 9 of the latter. The holes 14 represent openings for illumination purposes, through which the contact springs 20 and the flexible circuit board 8 can be welded directly to the conductor 9 during assembly by means of a laser beam.

A valve hole 15 forms the seat for the solenoid valve 3, which is set into the valve plate 1. Shaped seals 16 are used to seal the valve plate 1 against the egress of hydraulic fluid and these are attached to the circumference of the valve body 3 at the level of the valve hole 15.

Figure 4:
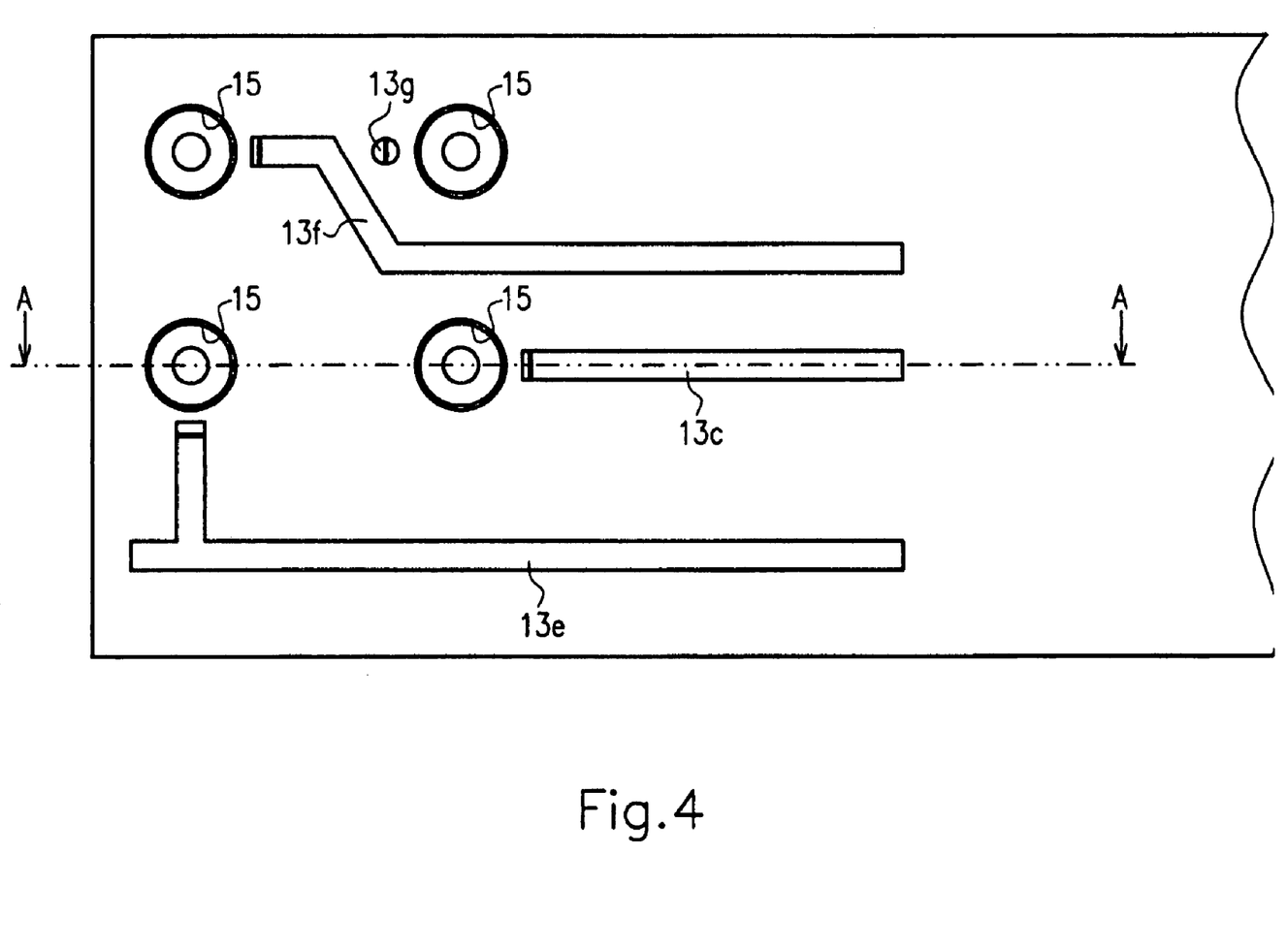
FIG. 4 a schematic representation of the lower side of the hydraulic distribution plate shown in FIGS. 1 and 2 viewed from above.

FIG. 4 shows the lower side of the valve plate 1 shown in FIG. 2 to explain the path of the pneumatic channels. In addition to the channel 13*c* further horizontal channels 13*e*, 13*f* and a vertical spur channel 13*g* extend toward the valve holes 15.

Figure 5:
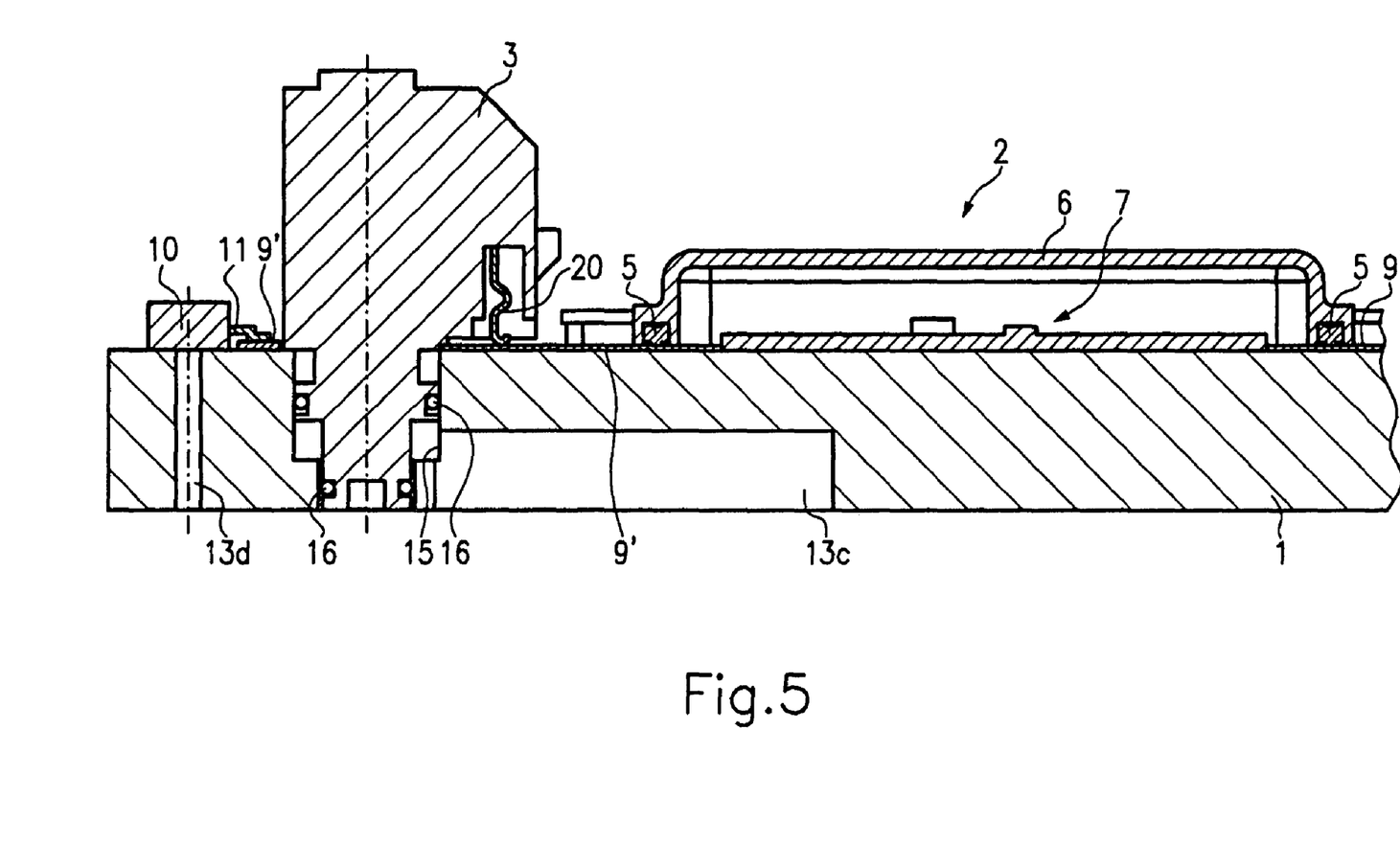
FIG. 5 a sectional representation of a second exemplary embodiment of the invention according to the representation in FIG. 3.

FIG. 5 shows a longitudinal sectional representation of a further exemplary embodiment of the invention. The second exemplary embodiment primarily differs from the first exemplary embodiment in that conductors 9' are incorporated into the valve plate 1 by means of MID technology.

MID technology allows the assembly of conductor structures both on the surface of the valve plate 1 and inside the valve body 1. In both cases electrically conductive, plastic structures resembling conductor tracks are first constructed (i.e. either formed on the surface of the valve plate by spraying and structuring or cast inside the valve plate) and then metallized. Metallization may be achieved by means of galvanizing, i.e. the depositing of metal on the plastic structures resembling conductor tracks.

With the exemplary embodiment shown in FIG. 5 the circuit support 7 is stuck directly onto the valve plate 1. No metal base plate 4 is required. The conductors 9' formed in the valve plate 1 can be inserted between the surface of the valve plate 1 and the shaped seal 5 into the inner chamber of the electronic control unit module 2, without leaks occurring around the insertion area.

The electronic control unit can be cooled according to the first exemplary embodiment (see FIG. 3) by means of a chamber 12*a* and pneumatic channels 13*a*, 13*b*. Holes 14 are not required with this exemplary embodiment.

Figure 6:
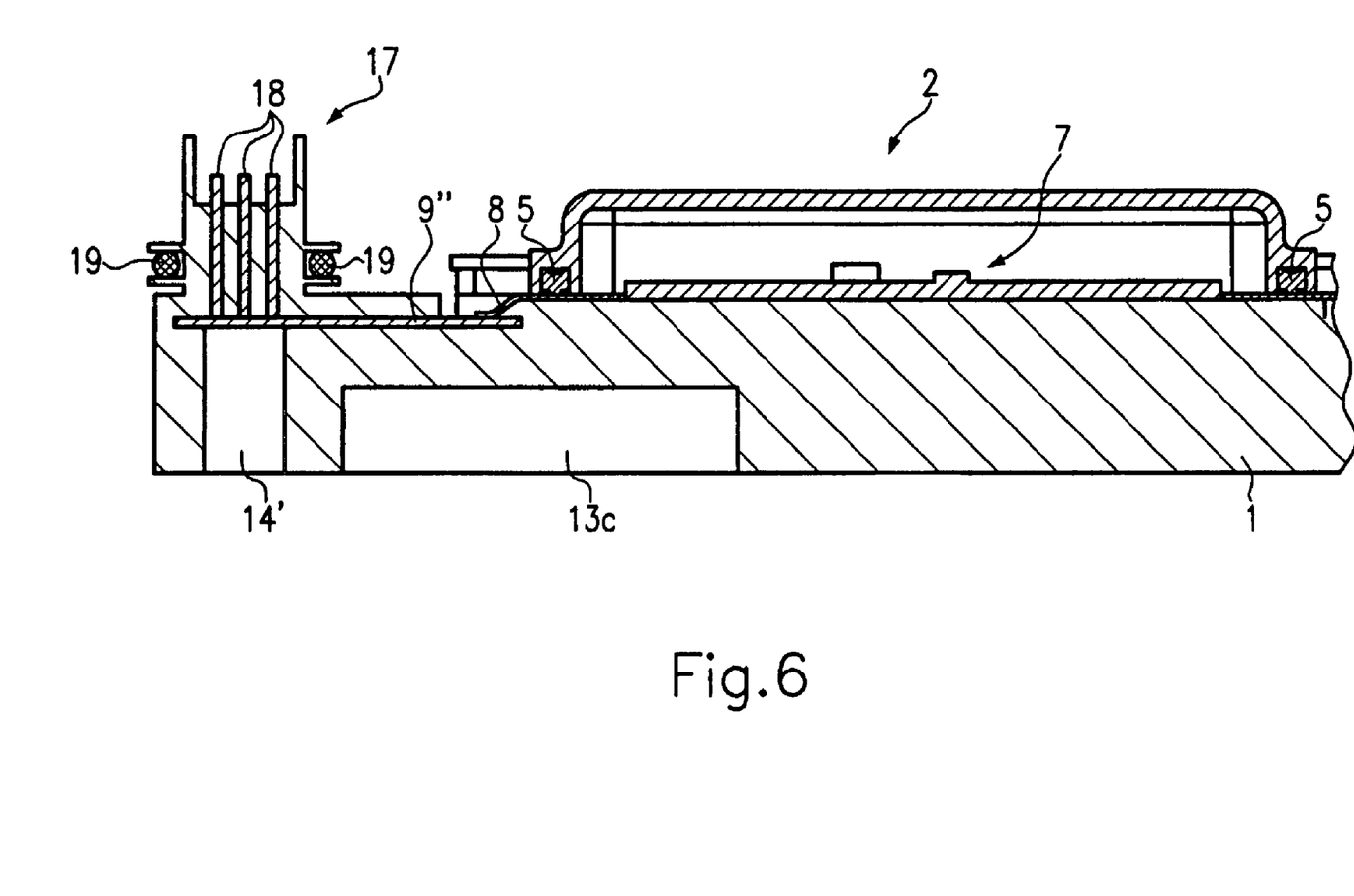
FIG. 6 a sectional representation of a further exemplary embodiment of the invention according to the representation in FIG. 3.

FIG. 6 shows a further exemplary embodiment of the invention, in which a conductor 9" routed inside the valve plate 1 makes contact with the electronic control unit module 2 with a gearbox connector 17. The gearbox connector 17 is formed as a single piece with the valve plate 1 and has sprayed connector pins 18, one end of which is connected to the conductor 9", while the other end projects out of the connector body 17 as a pin.

In the integrated state the gearbox connector 17 projects through a connector opening in the gearbox housing, to connect there with a reverse connector of complementary form outside the gearbox. The seal for this insertion is ensured by a sealing ring 19 around the gearbox connector 17. Alternatively the connector 17 can also be an internal connector.

A hole 14' in the rear section of the gearbox connector 17 allows the connector pins 18 to make contact with the electric conductors 9" via a weld, solder or other contact method. Alternatively the electric conductors 9" and the pins 18 can also be manufactured as a single piece, e.g. in the form of curved conductor wires, which means there is no need for the contact stage.

A further option (not shown) is for the base plate 4 also to be integrated in the valve plate 1 during the latter's manufacture (injection molding). In this case too the base plate 4 can form the cover element of a pneumatic chamber like the chamber 12*a*.

The measures described using the different exemplary embodiments can be combined and always allow the plastic valve plate 1 to have the dual function of element for the distribution of hydraulic fluid and conductor support.

The invention claimed is:

1. A hydraulic motor vehicle gearbox control device comprising:
    a plastic hydraulic distribution plate having a metal base plate integrated therein, the metal base plate adapted for receipt of an electronic control unit for a hydraulic motor vehicle gearbox, the hydraulic distribution plate having channels therethrough for the distribution of hydraulic fluid to contact the metal base plate to cool circuit electronics of the electronic control unit housed on said metal base plate;
    the hydraulic distribution plate having electric conductors embedded therein.

2. The hydraulic motor vehicle gearbox control device according to claim 1, wherein
    the conductors embedded in the hydraulic distribution plate are encapsulated, the conductors selected from the group consisting of sprayed metal wires, pins, strips or punched lattices.

3. The hydraulic motor vehicle gearbox control device according to claim 1, wherein
    the hydraulic distribution plate is configured as an injection molded MID circuit support.

4. The hydraulic motor vehicle gearbox control device according to claim 1, wherein
    the conductors extend between an electronic control unit module secured on the hydraulic distribution plate and at least one solenoid valve for the hydraulic control system.

5. The hydraulic motor vehicle gearbox control device according to claim 1, wherein
    the conductors extend between the electronic control unit and a gearbox connector attached to the distribution plate.

6. The hydraulic motor vehicle gearbox control device according to claim 4, wherein
the electronic control unit is in contact with the electric conductors via a flexible circuit board.

7. The hydraulic motor vehicle gearbox control device according to claim 4, wherein
a channel is arranged for hydraulic fluid in the hydraulic distribution plate adjacent to the electronic control unit module.

8. The hydraulic motor vehicle gearbox control device according to claim 4, wherein
the metal base plate is cast in the hydraulic distribution plate.

9. The hydraulic motor vehicle gearbox control device according to claim 4, wherein
a circuit support of the electronic control unit module is secured directly onto the metal base plate.

10. The hydraulic motor vehicle gearbox control device according to claim 1, wherein the electric conductors are metallized on the surface of the plate.

11. A method for manufacturing a hydraulic motor vehicle gearbox control device comprising the steps of:
providing a plastic hydraulic distribution plate with channels therein for the distribution of hydraulic fluid, said hydraulic distribution plate having a metal base plate integrated within the hydraulic distribution plate and adapted to receive an electronic control unit whereby an electronic circuit of said electronic control unit is cooled by the distribution of fluid through said plate channels, said plated channels in contact with said metal base plate and
integrating electric conductors into the hydraulic distribution plate by spraying, encapsulating, mortising, or sticking.

12. The method according to claim 11, wherein
the conductors are integrated into the hydraulic distribution plate by means of an MID method.

13. An integrated hydraulic cooling fluid/signal and power distribution device for motor vehicle gearbox control systems, said device comprising:
a plastic plate having (i) channels extending therethrough for the receipt of hydraulic fluid, and (ii) electrical conductors structurally integrated therein and/or thereon, said plate comprising an integrated metal base plate adapted for receipt of an electronic control unit for said gearbox control system, said unit comprising an electronic circuit for electrical communication with said conductors, said circuit cooled by fluid passing through said channels extending through the plate, wherein the channels are in contact with the metal base plate.

14. A device according to claim 13, wherein the electronic circuit of the electronic control unit is in electrical communication with the conductors via a flexible circuit board.

15. A device according to claim 13, wherein the conductors are encapsulated or sprayed metal wires, pins, strips, or punched lattices.

16. A device according to claim 13, wherein the plastic plate is an injection molded MID circuit support.

17. A device according to claim 13, wherein the conductors extend between an electronic control unit module secured on the plastic plate and at least one solenoid valve.

18. A device according to claim 13, wherein the conductors extend between an electronic control unit module secured on the plastic plate and a gearbox connector attached to the plastic plate.

19. A device according to claim 17, wherein a channel is arranged for hydraulic fluid in the plastic plate adjacent to the electronic control unit module.

20. A device according to claim 17, wherein the metal base plate is cast in the plastic plate.

21. A device according to claim 13, wherein a surface section of the plastic plate forms a base plate for an electronic control unit module, and a circuit support of the electronic control module is secured onto this surface section of the plastic plate.

* * * * *